United States Patent [19]
Ellis

[11] Patent Number: 5,259,516
[45] Date of Patent: Nov. 9, 1993

[54] CLAMP MECHANISM

[75] Inventor: Stafford M. Ellis, West Sussex, England

[73] Assignee: GEC - Marconi Limited, England

[21] Appl. No.: 791,451

[22] Filed: Nov. 13, 1991

[30] Foreign Application Priority Data

Nov. 16, 1990 [GB] United Kingdom ............. 9024973

[51] Int. Cl.⁵ .................. A47G 29/00; H05K 5/00
[52] U.S. Cl. .............................. 211/41; 211/26
[58] Field of Search ............. 248/509, 689, 316.2, 248/231.3; 211/41, 26; 361/399, 413, 415

[56] References Cited

U.S. PATENT DOCUMENTS

| | | | |
|---|---|---|---|
| 3,451,034 | 6/1969 | Beale | 211/41 X |
| 3,970,198 | 7/1976 | Prater | 211/41 |
| 5,003,431 | 3/1991 | Imsdahl | 211/41 X |

FOREIGN PATENT DOCUMENTS 0071398  2/1983  European Pat. Off. .
2076228  11/1981  United Kingdom .
2137818  10/1984  United Kingdom .

Primary Examiner—Karen J. Chotkowski
Attorney, Agent, or Firm—Kirschstein, Ottinger, Israel and Schiffmiller

[57] ABSTRACT

A clamp mechanism (19) for clamping the edge (17) of a printed circuit board (11) between the side walls (91a, 91b) of a slot in a wall (93) of an enclosure for housing the board in parallel spaced relationship with other boards. The mechanism (19) comprises an elongated element (21) of resilient material having corrugations (23) whose crests are at regularly spaced positions along its length. An actuator (25) coupled with the elongated element for relative longitudinal motion therewith is provided with riser elements (31b) spaced like the corrugations and positioned so as to move on such relative motion into engagement with the crests to effect the required clamping action. The riser elements (31b) are in the form of rollers (31b) to minimize functional resistance to operation. A spigot arrangement (89, 95) on a lever 75 for operates the mechanism which provides positive locking of the board (11) when clamped.

8 Claims, 4 Drawing Sheets

CLAMP MECHANISM

BACKGROUND OF THE INVENTION

1. Field of the Invention

This invention relates to clamp mechanisms.

2. Description of Related Art

U.K. Patent Specification GB 2137818B discloses a clamp mechanism whereby a clamping force may be applied to a marginal portion of a board to which the mechanism is attached so as to secure the board against extraction from between two opposed flat parallel walls by coaction between a corrugated strip of a resilient material and a rigid elongate body having a multiplicity of risers distributed therealong with the pitch spacing of the crests of the corrugations of the strip element. Upon relative longitudinal displacement between the said elongate body and the corrugated strip the risers contact the corrugations and the combination comprising the mechanism and the board expands until limited against further such expansion by the opposed walls, further relative longitudinal displacement as aforesaid resulting in a flattening compression in the corrugated strip with the result that a high frictional force is developed between the walls and the mechanism and board.

The disadvantage of the aforedescribed arrangement is that in order to hold frictional levels between the risers and the corrugated strip to an acceptably low value enabling the clamp mechanism to be operated, i.e. relative longitudinal displacement as aforesaid to be produced, without undue effort on the part of the user, the corrugated strip must be of suitably low gauge strip material. In the result the clamping pressures are lower than might be wished, and in particular, the thermal contact between a portion of a heat conductive ladder carried by the marginal board portion on its major surface opposite to that to which the clamp mechanism is attached and the adjacent wall surface may be less than satisfactory.

SUMMARY OF THE INVENTION

It is an object of the present invention to provide a clamp mechanism whereby this problem is alleviated.

According to the present invention there is provided a clamp mechanism for clamping a marginal portion of a board between two opposed substantially flat and parallel wall surfaces, the mechanism comprising: an elongate element composed of resilient material having, transverse to its direction of length, corrugations having crests which have a pitch spacing; and elongate actuation means extending lengthwise in the same direction as said elongate element and coupled therewith so as to be constrained for relative longitudinal displacement therewith; the mechanism being such that when mounted on a major surface of a said marginal board portion and located between said opposed wall surfaces, upon relative longitudinal displacement between said actuation means and the corrugated element, the mechanism expands laterally as a result of contact between said actuating means and the corrugations of the corrugated element, such expansion being limited on the one hand, by contact between said marginal board portion and one said wall surface and, on the other hand, by contact between said actuating means and the other said wall surface, further relative longitudinal displacement between the actuating means and the corrugated element resulting in a flattening compression in the corrugated element, thereby to increase the frictional resistance to relative movement between the mechanism and board and said wall surfaces; characterised in that said actuation means comprises a rigid elongate main body part and first and second sets of rolling elements carried thereby, the several rolling elements in each said set being distributed along said body part and being respectively rotatable about individual axes extending transversely to the longitudinal direction of said body part, the rolling elements of said second set, at least, being spaced apart, along the body part by said pitch spacing; and in that on said relative longitudinal displacement between said actuation means and said corrugated element said rolling elements in said first set contact said other wall surface and said rolling elements in said second set contact said corrugations.

Preferably said body part has a multiplicity of apertures therethrough at intervals spaced apart by said pitch distance; and the rolling elements in said first and second sets are located at said apertures, the elements of the first set projecting from the apertures proud of one surface of the body part and the elements of the second set projecting from the apertures proud of an opposite surface of the body part.

Preferably the several rolling elements in each set are respectively rotatable about individual axes fixed with respect to said body part.

The invention also extends to a clamp arrangement comprising a board, and mounted on a marginal portion of said board, a clamp mechanism according to the invention.

In such an arrangement the corrugated element is suitably secured to the said marginal board portion, and the body part of the actuation means and said corrugated element are coupled so as to permit longitudinal movement of the actuation means with respect to the corrugated element.

According to the invention, also, there is provided a clamp arrangement comprising: a board and a mechanism for clamping a marginal portion of the board between two opposed substantially flat and parallel wall surfaces, the mechanism being mounted on said marginal board portion and comprising: an elongate element composed of resilient material having, transverse to its direction of length, corrugations having crests which have a pitch spacing; actuation means in the form of an elongate member having, protruberant from a first surface thereof, elements spaced apart by said pitch spacing; and a lever having a first pivotal connection with the board and a second pivotal connection with the elongate member at one end thereof, the said elongate member and the corrugated element extending lengthwise in the same direction and being coupled together so as to be constrained for relative longitudinal displacement on rotation of said lever; said relative longitudinal displacement causing the mechanism to expand laterally as a result of contact between said protruberant elements and said corrugations of the corrugated element, such expansion being limited, on the one hand, by contact between the said marginal board portion and one said wall and, on the other hand, by contact between said elongate member and the other said wall, further relative longitudinal displacement between the elongate member and the corrugated element resulting in a certain flattening compression in the corrugated element, such compression attaining a maximum when, during relative displacement as aforesaid, the protruberant elements and crests of the corrugated element become coincident, characterised in that with the corrugated element in its maximally compressed configuration, as aforesaid, the lever has an angular position with respect to the board such that a laterally projecting spigot on said lever is received by a recess formed in a further wall surface, said spigot and said recess cooperating to provide positive retention of the board.

The protruberant elements may be rolling elements mounted on said elongate member or they may be cam surfaces formed on the elongate member.

BRIEF DESCRIPTION OF THE DRAWINGS

One clamp arrangement in accordance with the invention will now be described by way of example with reference to the accompanying drawings, in which:

FIG. 3 is a scrap diagram, being an enlarged presentation of a section on the line III—III in FIG. 1;

DETAILED DESCRIPTION OF THE PREFERRED EMBODIMENT

Figure 1:
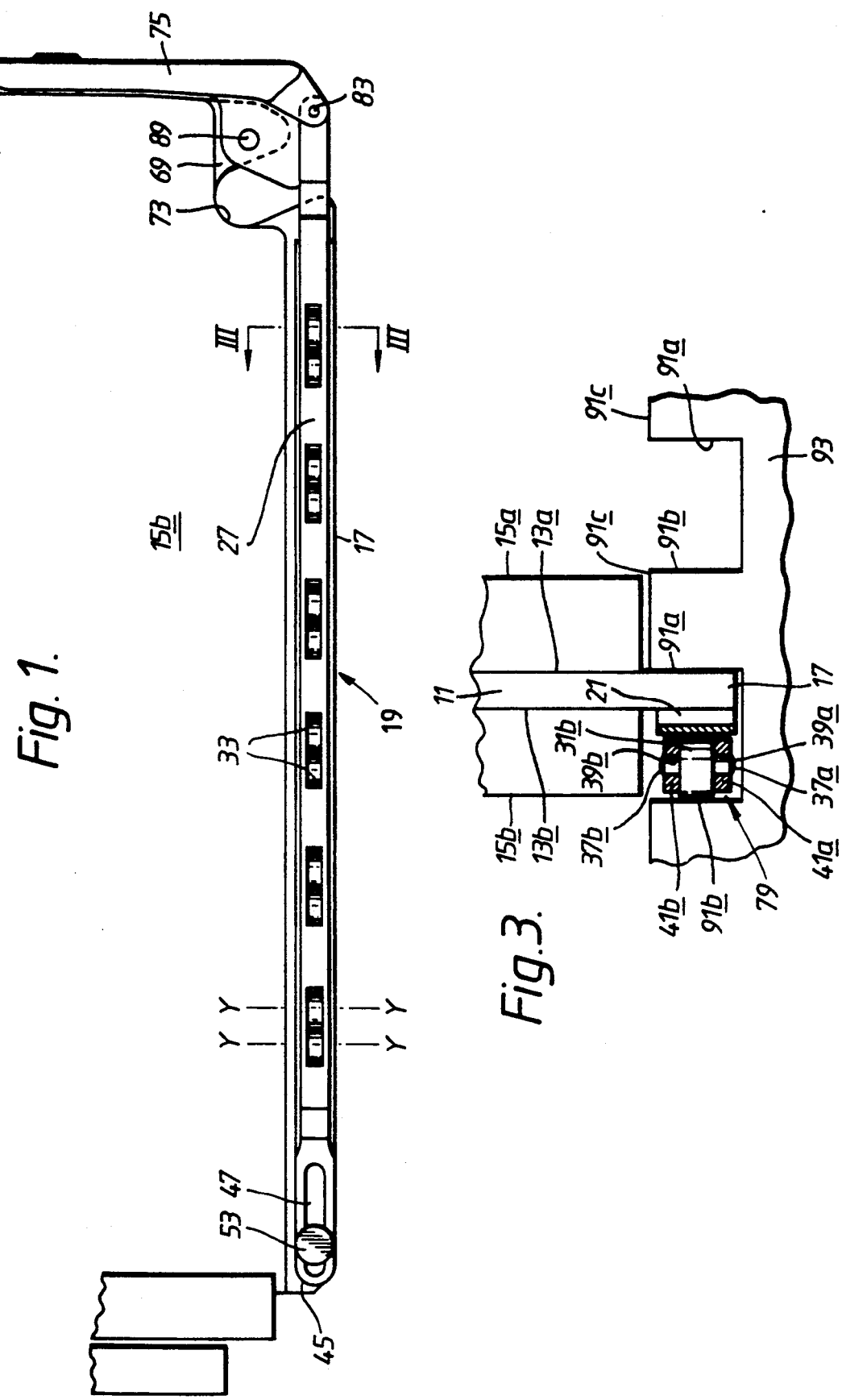
FIG. 1 shows, in plan, a part of the arrangement.
Figure 2:
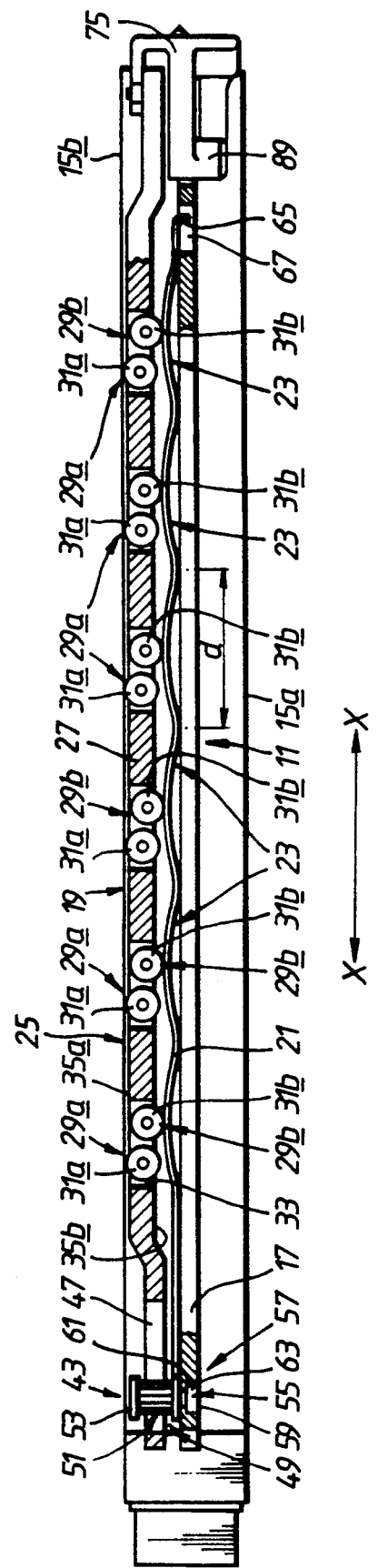
FIG. 2 shows the part of the arrangement of FIG. 1 in part sectional elevation.
Figure 4:
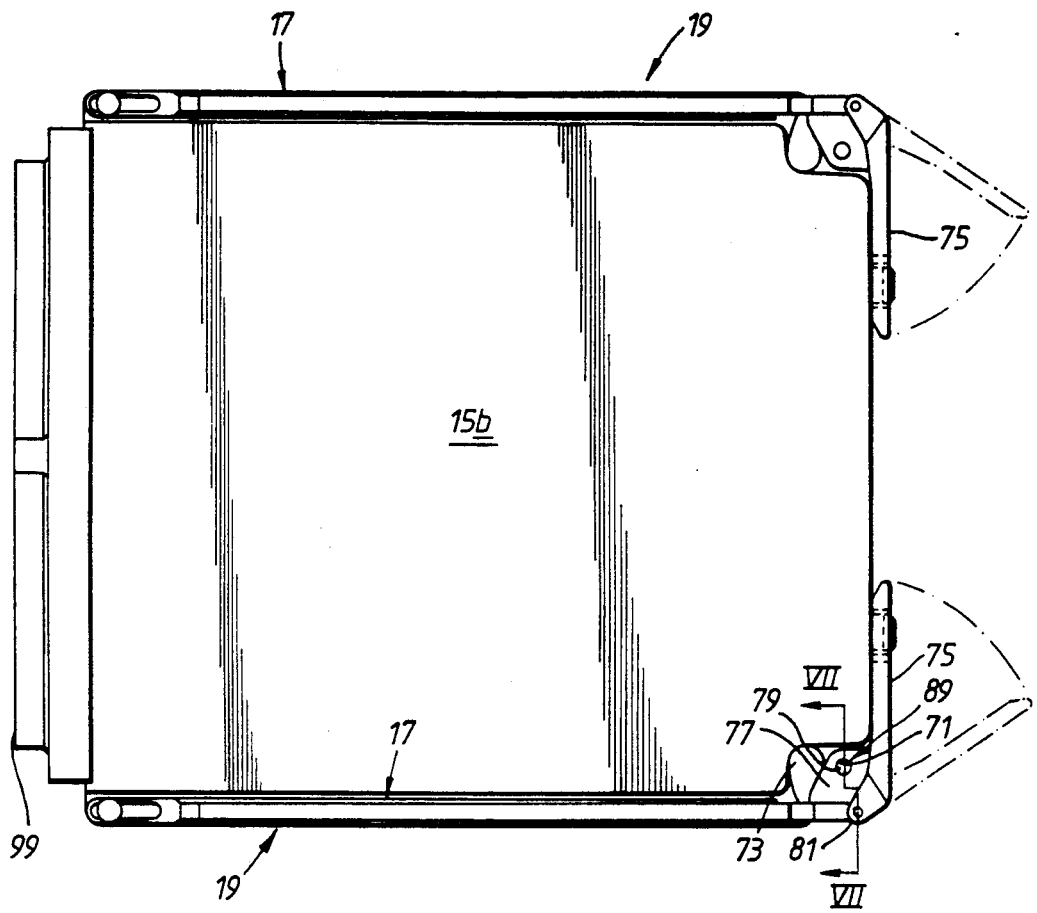
FIG. 4 shows, in plan, the whole clamp arrangement.
Figure 5:
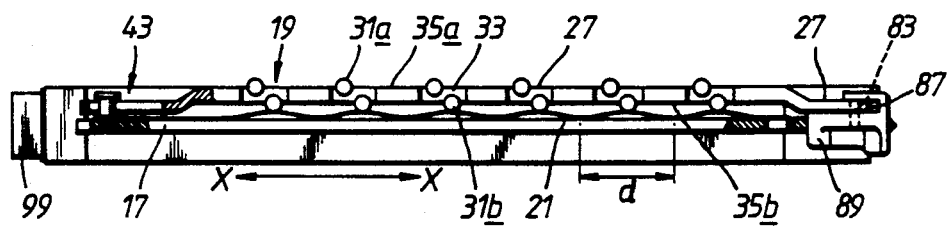
FIG. 5 shows the arrangement of FIG. 4 in part sectional side elevation.
Figure 6:
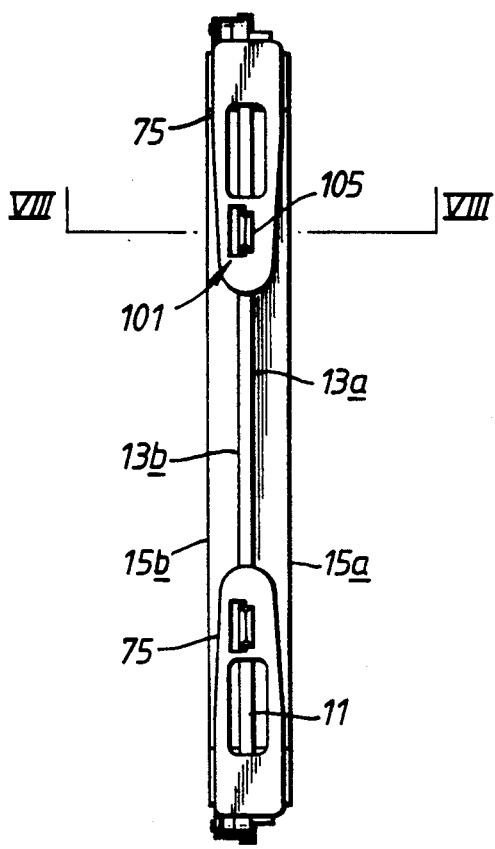
FIG. 6 shows the arrangement of FIG. 4 in end elevation.
Figure 7:
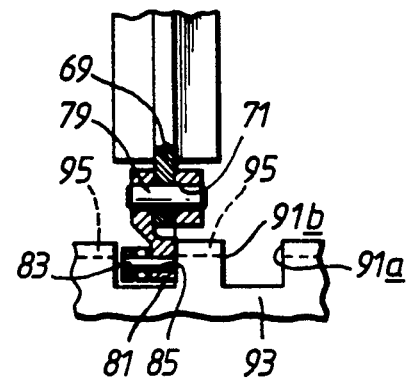
FIG. 7 shows a section on VII—VII of FIG. 4.
Figure 8:
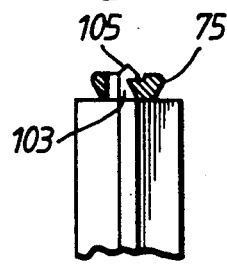
FIG. 8 shows a section on VIII—VIII of FIG. 6.

The clamp arrangement serves to secure a computer module in parallel spaced relationship with other such modules in a box. Opposite edges of the modules fit into slots defined by opposed surfaces of opposite walls of the box which serve as cold walls to carry away heat from the modules.

Referring to the drawings, each module comprises a board 11, first and second multiplicities of electronic components (not illustrated) carried by the board 11 at major surfaces 13a, 13b, respectively, thereof, and two housing 15a, 15b which with the board 11 respectively cover and protect the said multiplicities of components against environmental contamination.

The board 11 has on one 13a of its major surfaces a heat conductive pattern, or heat ladder (not shown), for conducting heat away from electronic components to two major heat conductive segment of the pattern, being segments extending transversely of the associated major board surface 13a at opposite marginal board portions 17.

A clamp mechanism 19 is mounted connected to each marginal board portion 17 on the side of the board opposite to the aforesaid heat conductive segment.

Each clamp mechanism 19 is an assembly which comprises: an elongate element 21 composed of strip material such for example as spring steel possessing a high modulus of elasticity and having, transverse to its direction of length X—X, corrugations 23 the crests of which are spaced apart by a certain pitch distance d; and actuation means 25 having a rigid elongate main body part 27 and first and second sets, 29a, 29b, respectively, of rolling elements 31a, 31b, carried thereby.

The rolling elements 31a, 31b, are distributed along the body part 27 and are respectively rotatable about individual axes, such as Y—Y, extending transversely to the direction of length of the body part 27, the rolling elements of each set being spaced apart along the body part 27 by the aforesaid pitch distance d.

As shown, the body part 27 has a multiplicity of apertures 33, (six in the example) therethrough at intervals spaced apart by the pitch distance d, and each pair of rolling elements 31a and 31b, is located at a respective one of the apertures 33. The rolling elements 31a of the first set 29a project proud of one surface 35a, of the body part 27 and the elements 31b of the second set 29b project proud of the opposite surface 35b of the body part 27.

The several transverse axes Y—Y are fixed with respect to the body part 27, the rolling elements being provided with axially projecting first and second spigot portions 37a, 37b, respectively received within first and second passages 39a, 39b, piercing opposite side walls 41a, 41b, respectively, of the body part 27 at the sites of the apertures 33.

The body part 27 and the corrugated element 21 are coupled together so as to permit relative longitudinal movement, i.e. movement in the direction X—X therebetween, within certain limits. For this purpose there is a pin and slot connection 43 between the coupled parts 21, 27, the part 27 being formed towards one end 45 with a slot 47 and the element 21 being provided with a two-part pin 49, one part 51 of which has a head 53 of diameter greater than the width of the slot 47 and the other part 55 of which is a stud extending through an aperture formed through the element 21 at one end 57 and having a threaded or other connection with the part 51.

The marginal board portion 17 has an aperture 59 therethrough formed with an intermediate internal shoulder 61, the head 63 of the stud 55 bearing against the internal shoulder 61, and the lower surface of the part 51 bearing against the corrugated element 21 at the position of the aforesaid aperture 59.

The end 65 of the element 21 remote from the pin 49 is upset and the board 11 has an aperture 67 which receives the upset end 65 of the element 21 and, in so receiving, locates the element 21 against unwanted movement whilst accommodating sliding movement of the upset part 65 in the direction X—X.

The board 11 has formed at a corner thereof a nose portion 69 having an aperture 71 and adjacent to the nose portion a recess 73. A lever 75 has towards one end thereof a dorsal flange portion 77 and a lever hinge pin 79 projecting laterally from the said flange portion 77 is received within the nose portion aperture 71 so as to permit pivotal movement of the lever 75 about the hinge axis defined by the pin 79.

The lever 75 is pivotally connected near an end 81 thereof to the body part 27. A hinge pin 83 extends from an aperture 85 in the dorsal flange portion 77 of the lever 75 adjacent the end 81 thereof through an aperture through the body part 27 adjacent to the end 87 thereof.

The dorsal flange portion 77 has, projecting from the side thereof opposite to the side adjacent to the position of connection between the body part 27 and the said lever portion 77, a spigot 89 projecting laterally of the flange portion 77 at a position eccentric with respect to the axis of the hinge pin 83.

The board 11 (with electronic components mounted thereon under the covers 15a, 15b) and the clamp mechanism 19 are shown received with the lower marginal board portion 17 carrying a transversely extensive major heat conductive segment between two opposed flat and parallel surfaces as 91a, 91b, respectively, being surfaces of an adjacent cold wall 93 to which component heat is to be transferred from the said major heat conductive segment.

Figure 9:
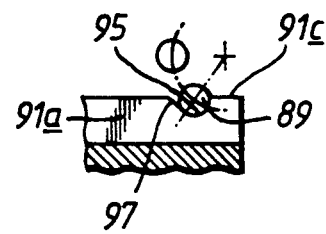
FIG. 9 is a scrap diagram of part of the arrangement of FIG. 4.

An outer wall surface 91c of the cold wall 93 between surfaces 91a, 91b is provided with a transversely extensive recess 95 semi-cylindrical in shape save for a lead-in portion 97 (FIG. 9).

To enable the board 11 and mechanism 19 to be received within the channel defined by the opposed cold wall surfaces 91a, 91b, the lever 75 must be away from the full line, depressed position illustrated, and in the lever position represented in broken line. With the lever 75 at the latter position the clamp mechanism is in the unexpanded state, the rollers 31b being displaced from the crests of the corrugations 23 of the element 21. The lever end 81 is, as a result of lever displacement about the axis of pin 79, inwardly displaced from the position illustrated, movement at the pin and slot connection 47, 53, of the rigid body part 27 permitting such lever displacement.

With the board 11 and clamp mechanism 19 fully inserted between the wall surfaces 91a, 91b, a connector half 99 carried by the board 11 of the component module mates with a complementary connector half carried by a back plane (not shown).

With the connector halves so mated counter-clockwise rotation of the lever 75 about the hinge pin 79 causes withdrawal of the body part 27 and the rollers 31b in the set 29 to roll in contact with the corrugations 23 of the element 21 until, with such withdrawal limited by contact between the pin 43 and the inner end of the slot 47, the rollers 31b and the crests of the corrugations 23 are in contact. In the course of such action, the assembly expands, laterally, such expansion being limited by the spacing between the cold wall surfaces 91a, 91b. Further withdrawal of the body part 27 results in a certain flattening compression (as illustrated) of the element 21. With the rolling elements 31b respectively at the crests of the corrugations 23 and with the flattening of the element 21 therefore at a maximum, a high frictional resistance exists between the board 11 and the adjacent cold wall surface 91a substantially preventing movement of the board at the connection, and the rolling elements 31a, bear on the other cold wall surface 91b. With the lever in the (full line) depressed position the spigot 89 locates in the semi-cylindrical recess 95 in the adjacent outer surface 91c of the adjacent cold wall 93. The spigot 89 so located provides a positive retention for the board 11 against withdrawal. To prevent accidental rotation of the lever 75 from the depressed position an integral catch portion 101 at the board edge is, during rotation to the depressed position, resiliently deflected by contact between an edge of an aperture 103 in the lever 75 and an inclined upper surface of a catch head 105. In the final depressive movement of the lever 75, the catch head 105 penetrates the aperture 103 to spring back to the undeflected state. In the latter state the catch head 105 constitutes a bar to rotation of the lever 75 away from the depressed position, manual deflection of the catch head 105 being required to free the lever 75 for such travel.

I claim:

1. A clamp mechanism for clamping a marginal portion of a board between two opposed substantially flat and parallel wall surfaces, the mechanism comprising: an elongate corrugated element composed of resilient material having, transverse to its direction of length, corrugations having crests which have a pitch spacing; and elongate actuation means extending lengthwise in the same direction as said elongate corrugated element and coupled therewith so as to be constrained for relative longitudinal displacement therewith; the mechanism being such that when mounted on a major surface of a said marginal board portion and located between said opposed wall surfaces, upon relative longitudinal displacement between said actuation means and the corrugated element, the mechanism expands laterally as a result of contact between said actuating means and the corrugations of the corrugated element, such expansion being limited on the one hand, by contact between said marginal board portion and one said wall surface and, on the other hand, by contact between said actuating means and the other said wall surface, further relative longitudinal displacement between the actuation means and the corrugated element resulting in a flattening compression in the corrugated element, thereby to increase frictional resistance to relative movement between the mechanism and board and said wall surfaces; said actuation means comprising a rigid elongate main body part and first and second sets of rolling elements carried thereby, the rolling elements in each said set being distributed along said body part and being respectively rotatable about individual axes extending transversely to the longitudinal direction of said body part, the rolling elements of said second set, at least, being spaced apart, along the body part by said pitch spacing; and in that on said relative longitudinal displacement between said actuation means and said corrugated element said rolling elements in said first set contact said other wall surface and said rolling elements in said second set contact said corrugations.

2. A mechanism according to claim 1 wherein said body part has a multiplicity of apertures therethrough at intervals spaced apart by said pitch distance; and the rolling elements in said first and second sets are located at said apertures, the elements of the first set projecting from the apertures proud of one surface of the body part and the elements of the second set projecting from the apertures proud of an opposite surface of the body part.

3. A mechanism according to claim 2 wherein the rolling elements in each said set are respectively rotatable about individual axes fixed with respect to said body part.

4. A clamp arrangement comprising a board and mounted on a marginal portion of said board a mechanism according to claim 1.

5. An arrangement according to claim 4 wherein the corrugated element is secured to said marginal board portion, and the body part of the actuation means and said corrugated element are coupled so as to permit longitudinal movement of the actuation means with respect to the corrugated element.

6. An arrangement according to claim 4 wherein said mechanism further includes a lever having a first pivotal connection with the board and a second pivotal connection with the rigid elongate main body part of the actuation means so as to cause said relative longitudinal displacement on rotation of said lever, said lever having a projecting spigot which, when said lever is in an angular position such that the rolling elements in said second set contact the crests of said corrugations and the flattening compression in the corrugated element is a maximum, is received by a recess formed in a further wall surface, said spigot and said recess co-operating to provide positive retention of the board.

7. A clamp arrangement comprising: a board and a mechanism for clamping a marginal portion of the board between two opposed substantially flat and parallel wall surfaces of a wall, the mechanism being mounted on said marginal board portion and comprising: an elongate corrugated element composed of resilient material having, transverse to its direction of length, corrugations having crests which have a pitch spacing; actuation means in the form of an elongate member having, protuberant from a first surface thereof, elements spaced apart by said pitch spacing; and a lever having a first pivotal connection with the board and a second pivotal connection with the elongate member at one end thereof, said elongate member and the corrugated element extending lengthwise in the same direction and being coupled together so as to be constrained for relative longitudinal displacement on rotation of said lever; said relative longitudinal displacement causing the mechanism to expand laterally as a result of contact between said protruberant elements and said corrugations of the corrugated element, such expansion being limited, on the one hand, by contact between said marginal board portion and one said wall surface and, on the other hand, by contact between said elongate member and the other said wall surface, further relative longitudinal displacement between the elongate member and the corrugated element resulting in a certain flattening compression in the corrugated element, such compression attaining a maximum when, during said relative displacement, the protuberant elements and crests of the corrugated element become coincident; when the compression in the corrugated element attains said maximum, the lever has an angular position with respect to the board such that a laterally projecting spigot on said lever is received by a recess formed in a further wall surface at said wall, said spigot and said recess co-operating to provide positive retention of the board.

8. An arrangement according to claim 7 wherein the protuberant elements are rolling elements mounted on said elongate member.

* * * * *